(12) United States Patent
Agarwal et al.

(10) Patent No.: US 8,120,083 B2
(45) Date of Patent: Feb. 21, 2012

(54) POLYMER-BASED FERROELECTRIC MEMORY

(75) Inventors: Vishnu K. Agarwal, Boise, ID (US); Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/847,531

(22) Filed: Jul. 30, 2010

(65) Prior Publication Data

US 2010/0290265 A1 Nov. 18, 2010

Related U.S. Application Data

(60) Continuation of application No. 11/215,778, filed on Aug. 30, 2005, now Pat. No. 7,768,049, which is a division of application No. 10/421,157, filed on Apr. 23, 2003, now Pat. No. 7,049,153.

(51) Int. Cl.
*H01L 21/02* (2006.01)
(52) U.S. Cl. ........ 257/295; 257/369; 257/306; 257/529; 438/259; 438/261; 438/624; 438/623; 438/780
(58) Field of Classification Search .......... 257/295, 257/306, 369, 529; 438/259, 261, 624, 623, 438/780
See application file for complete search history.

(56) References Cited

U.S. PATENT DOCUMENTS

| | | | |
|---|---|---|---|
| 4,651,310 A | 3/1987 | Kaneko et al. | |
| 5,008,541 A | 4/1991 | Audaire et al. | |
| 5,656,882 A | 8/1997 | Lazarus et al. | |
| 5,949,507 A | 9/1999 | Shimada et al. | |
| 6,052,354 A | 4/2000 | Gudesen et al. | |
| 6,055,180 A | 4/2000 | Gudesen et al. | |
| 6,064,615 A | 5/2000 | Gudesen | |
| 6,084,850 A | 7/2000 | Gudesen et al. | |
| 6,088,319 A | 7/2000 | Gudesen | |
| 6,219,160 B1 | 4/2001 | Nordal et al. | |
| 6,326,936 B1 | 12/2001 | Inganas et al. | |
| 6,403,396 B1 | 6/2002 | Gudesen et al. | |
| 6,420,190 B1 | 7/2002 | Shimoda et al. | |
| 6,548,343 B1 | 4/2003 | Summerfelt et al. | |
| 6,576,479 B2 | 6/2003 | Chen et al. | |
| 6,627,944 B2 | 9/2003 | Mandell et al. | |
| 6,670,659 B1 | 12/2003 | Gudesen et al. | |
| 6,773,929 B2 | 8/2004 | Oh et al. | |
| 6,878,980 B2 | 4/2005 | Gudesen et al. | |
| 7,049,153 B2 | 5/2006 | Agarwal et al. | |
| 7,768,049 B2 * | 8/2010 | Agarwal et al. | ............... 257/295 |
| 2001/0052608 A1 | 12/2001 | Agarwal et al. | |

(Continued)

OTHER PUBLICATIONS

Amanuma, Kazushi, et al., "Capacitor-on-Metal/Via-stacked-Plug (CMVP) Memory Cell for 0.25 um CMOS Embedded FeRAM", IEDM '98 Technical Digest., International Electron Devices Meeting, (Dec. 6-9, 1998), 363-366.

(Continued)

*Primary Examiner* — Zandra Smith
*Assistant Examiner* — Telly Green
(74) *Attorney, Agent, or Firm* — Schwegman, Lundberg & Woessner, P.A.

(57) ABSTRACT

Apparatus and systems may comprise electrode structures that include two or more dissimilar and abutting metal layers on a surface, some of the electrode structures separated by a gap; and a polymer-based ferroelectric layer overlying and directly abutting some of the electrode structures. Methods may comprise actions to form and operate the apparatus and systems. Additional apparatus, systems, and methods are disclosed.

20 Claims, 8 Drawing Sheets

U.S. PATENT DOCUMENTS

| | | |
|---|---|---|
| 2001/0052609 A1 | 12/2001 | Agarwal et al. |
| 2002/0084481 A1 | 7/2002 | Lian et al. |
| 2002/0163057 A1 | 11/2002 | Bulovic et al. |
| 2002/0163828 A1 | 11/2002 | Krieger et al. |
| 2002/0163829 A1 | 11/2002 | Bulovic et al. |
| 2002/0163830 A1 | 11/2002 | Bulovic et al. |
| 2002/0163831 A1 | 11/2002 | Krieger et al. |
| 2003/0011016 A1 | 1/2003 | Agarwal et al. |
| 2003/0155602 A1 | 8/2003 | Krieger et al. |
| 2004/0026729 A9 | 2/2004 | Krieger et al. |
| 2006/0003472 A1 | 1/2006 | Agarwal et al. |

OTHER PUBLICATIONS

Choi, Jaewu, et al., "Changes in Metallicity and Electronic Structure Across the Surface Ferroelectric Transition of Ultrathin Crystalline Poly(vinylidene Fluoride-Trifluoroethylene) Copolymers", The American Physical Society, Physical Review Letters, vol. 80, No. 6, (Feb. 9, 1998), pp. 1328-1331.

Guy, Ian, et al., "C-V Properties of MIS Structures with a Ferroelectric Polymer Insulating Layer", Integrated Ferroelectrics, vol. 9, (1995), pp. 199-205.

Inoue, Naoya, et al., "Low thermal-budget fabrication of sputtered-PZT capacitor on multilevel interconnects for embedded FeRAM", International Electronic Devices Meeting, (Dec. 2000), pp. 797-800.

Ishiwara, Hiroshi, "Proposal of a Novel Ferroelectric-Gate Field Effect Transistor with Separated Functions for Data read-Out and Data Storage", Abstracts of the 1998 International Conference of Solid State Devices and Material, (1998), pp. 222-223.

Jung, Dongjin, et al., "A Novel Ir/IrO2/Pt-PZT/IrO2/Ir Capacitor for a Highly Reliable Mega-Scale FRAM", International Electronic Devices Meeting, (Dec. 2000), pp. 801-804.

Katoh, Y, et al., "Non-Volatile FCG (Ferroelectric-Capacitor and Transistor-Gate Connection) Memory Cell with Non-Destructive Read-Out Operation", Symposium on VLSI Technology, Digest of Technical Papers, (1996), pp. 56-57.

Kobayashi, S, et al., "64Kbit CMVP FeRAM macro with reliable retention/imprint characteristics", International Electronic Devices Meeting, (Dec. 2000), pp. 783-786.

Nakamura, Takashi, et al., "A Single-Transistor Ferroelectric Memory Cell", IEEE International Solid-State Circuits Conference, Digest of Technical Papers, (1995), pp. 68-69, 340.

Tokumitsu, Eisuke, et al., "Nonvolatile ferroelectric-gate field-effect transistors using SrBi2Ta2O9/Pt/SrTa2O6/SiON/Si structures", Applied Physics Letters, 75(4), (Jul. 26, 1999), 575-577.

Xia, Feng, et al., "Thickness dependence of ferroelectric polarization switching in poly(vinylidene fluoride-trifluoroethylene)spin cast films", Applied Physics Letters, 78(8), (Feb. 19, 2001), 1122-1124.

Yoon, Sung-Min, et al., "A Novel FET-Type Ferroelectric Memory with Excellent Data Retention Characteristics", International Electronic Devices Meeting, (Dec. 2000), pp. 317-320.

Yoon, Sung-Min, et al., "Improvement of Memory Retention Characteristics in Ferroelectric Neuron Circuits Using a Pt/SrBi2Ta2O9/Pt/Ti/SiO2/Si Structure-Field Effect Transistor as a Synapse Device", Japanese Journal of Applied Physics, 39, (Apr. 2000), 2119-2124.

\* cited by examiner

POLYMER-BASED FERROELECTRIC MEMORY

CROSS REFERENCE TO RELATED APPLICATION(S)

The present application is a continuation application of U.S. Ser. No. 11/215,778, filed on Aug. 30, 2005, now issued as U.S. Pat. No. 7,768,049, which is a divisional of U.S. Ser. No. 10/421,157, filed on Apr. 23, 2003, now issued as U.S. Pat. No. 7,049,153, which applications are herein incorporated by reference in their entirety.

BACKGROUND

Integrated memory circuits serve as data-storage components in thousands of products, from televisions, to automobiles, to computers. Often, these memory circuits are implemented as arrays of memory cells, with each memory cell storing an electrical charge representative of a one or a zero.

In recent years, these memory cells have been modified to include a layer of ceramic-based ferroelectric material that exhibits electric polarizations, analogous to north-south magnetic polarizations, in response to appropriate electrical signals. One electrical signal polarizes the material to represent a zero, and another signal oppositely polarizes the material to represent a one. The polarizations can be detected with special circuitry that allows recovery of stored data. Memory circuits using these ferroelectric memory transistors generally enjoy advantages, such as faster write cycles and lower power requirements, over conventional charge-storage memories.

More recently, polymer-based ferroelectrics have emerged as a potential substitute for ceramic-based ferroelectrics because they generally overcome or ameliorate problems, such as fatigue and imprint, that ceramic-based ferroelectrics may suffer. Moreover, polymer-based ferroelectrics are generally more amenable to use in multi-layer (stacked) memory circuits, which provide increased storage capacity. However, polymer-based ferroelectrics are not without their own problems.

For example, conventional fabrication methods that deposit the ferroelectric polymer over metal structures separated by empty gaps may create hills and valleys in the deposited ferroelectric material. The changing thickness of the ferroelectric material is undesirable, because it not only causes cell-to-cell performance variations, but also produces too many defective cells and thus reduces manufacturing yield. Poor yield ultimately raises the cost of manufacturing these type memories. Moreover, as the number of layers in a multi-layer memory increases, the hills and valleys tend to become higher and deeper, exaggerating the thickness variations in the deposited ferroelectric material and further detracting from desired performance and yield.

Accordingly, the present inventors have recognized a need for developing other methods of making polymer-based ferroelectric memories.

SUMMARY

To address these and other needs, unique methods, structures, circuits, and systems for polymer-based ferroelectric memories have been devised. One method entails forming an insulative layer on a substrate, forming two or more first conductive structures, with at least two of the first conductive structures separated by a gap, forming a gap-filling structure within the gap, and forming a polymer-based ferroelectric layer over the gap-filling structure and the first conductive structures.

In some embodiments, forming the gap-filling structure entails depositing a spin-on-glass material within the gap between the two first conductors and/or depositing a polymer-based material. For example, one embodiment deposits a polymer-based materials having a different solvent concentration than that used for the polymer-based ferroelectric. Still other methods extend the use of gap-filling structures to subsequent layers in a multi-layer memory circuit.

Other aspects of various embodiments include arrays of memory cells and memory circuits.

DETAILED DESCRIPTION

The following detailed description, which references and incorporates FIGS. 1-13, describes and illustrates specific embodiments of the invention. These embodiments, offered as examples, are shown and described in sufficient detail to enable those skilled in the art to implement or practice the invention. Thus, where appropriate to avoid obscuring the invention, the description may omit certain information known to those of ordinary skill in the art.

FIGS. 1-7 show a number of integrated-circuit assemblies, which collectively illustrate at least one method of fabricating polymer-based ferroelectric memory arrays according to the present invention. (Other embodiments may be formed by changing the order of formation or by combining or eliminating formation or processing of certain features.) FIG. 8 shows alternative polymer-based memory array using floating-gate transistors. FIGS. 9-12 collectively illustrate another method of fabricating polymer-based ferroelectric memory arrays according to the present invention. FIG. 13 shows a random-access-memory circuit incorporating ferroelectric memory transistors or memory cells of the present invention.

Fabrication Methods and Structures for Ferroelectric Memories

Figure 1:
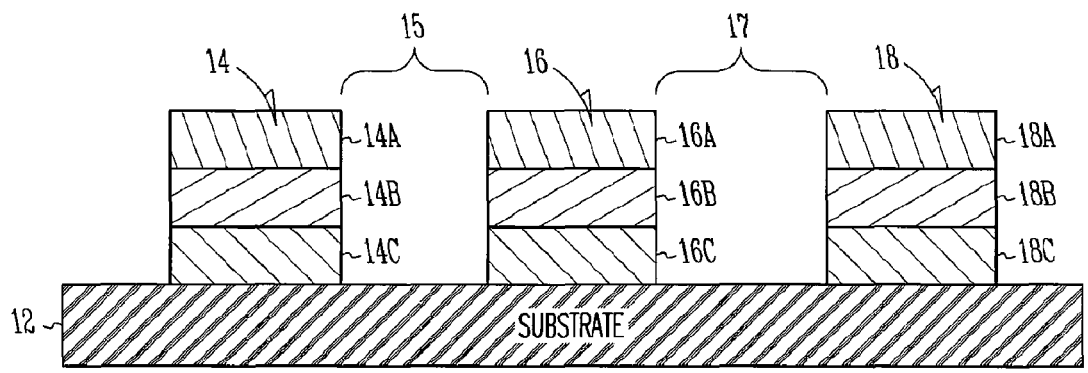
FIG. 1 is a cross-sectional view of an integrated-circuit assembly including a substrate 12, lower electrode structures 14, 16, and 18, and gaps 15 and 17.

The first method, as shown in FIG. 1, begins with formation of a number of lower electrode structures, such as electrode structures 14, 16, and 18, on a surface of a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

In this embodiment, substrate 12 comprises an insulative layer, which itself lies on a layer of semiconductive material (not shown). Useful insulative materials include silicon dioxide, silicon nitrides, silicon oxynitrides, or carbides. Useful semiconductive materials include silicon, silicon carbide, and silicon germanium. However, other embodiments may use different materials. This method forms the insulative layer through oxidation of the semiconductive surface. Other embodiments, however, may grow or deposit another insulative material. In some embodiments, substrate 12 comprises a layer of polymer, for example, a ferroelectric polymer, which is processed as a continuous roll.

More specifically, lower electrode structures 14, 16, and 18 include respective 5-100-nanometer-thick titanium layers 14A, 16A, and 18A; respective 20-1000-nanometer-thick aluminum layers 14B, 16B, and 18B; and respective 5-100-nanometer-thick titanium-nitride layers 14C, 16C, and 18C. (Other embodiments form layers 14C, 16C, and 18C using tantalum nitride, tungsten, and tungsten nitride.) Lower electrode structures 14 and 16 are separated by a gap 15, and lower electrode structures 16 and 18 are separated by a gap 17.

In this embodiment, forming the lower electrode structures entails sequential deposition of titanium, aluminum, and titanium nitride to form respective titanium, aluminum, and titanium-nitride layers. The titanium layer is then masked to define parallel conductive traces (which appear as islands in this cross-sectional view) and all three layers are etched down to (or into) substrate 12.

Some embodiments form the conductive layers of the electrode structures from different materials. For example, some embodiments replace the titanium-nitride layer with a platinum-based layer or a tantalum-nitride layer. And, some embodiments replace the aluminum layer with a copper-, sliver-, or gold-based metallic layer. Some embodiments may use non-metal conductive materials. Note that some embodiments form an adhesion layer on the substrate as preparation for the titanium or other metal.

Figure 2:
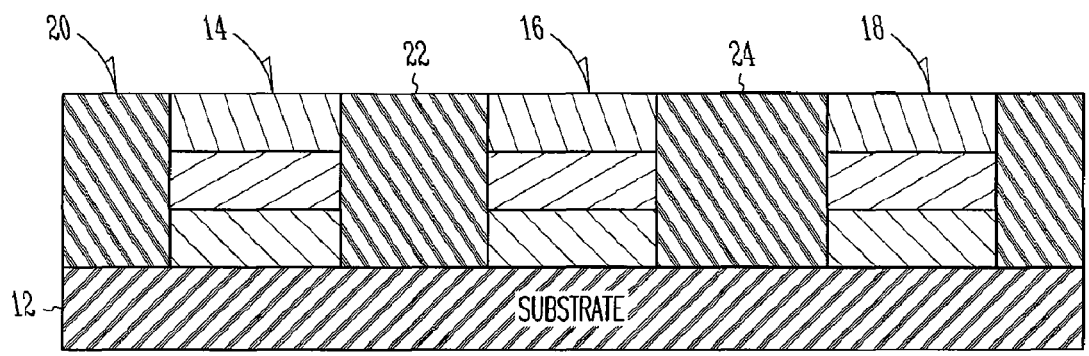
FIG. 2 is a cross-sectional view of the FIG. 1 assembly after forming gap-filling layer 20, which includes gap-filling structures 22 and 24.

FIG. 2 shows that after forming the lower electrode structures 14, 16, and 18, the method forms a gap-filling layer 20, which substantially fills gaps 15 and 17 (in FIG. 1) with respective gap-filling structures 22 and 24. In some embodiments, gap-filling layer 20, which has a thickness that is 20-200 nanometers or 10-100 percent thicker than the height of the lower electrode structures, comprises an insulative material, such as a spin-on-glass material, a Flow-Fill™ oxide, a high-density-plasma (HDP) oxide, or an insulative polymer. (Flow-fill may be a trademark of Electrotech Limited of Bristol, United Kingdom. For further information regarding a flow-fill technique, see, for example, U.S. Pat. No. 6,372,669, which is assigned to the assignee of the embodiments described in this document, and incorporated herein by reference in its entirety.) In some other embodiments, gap-filling layer has thickness which makes it substantially flush with the lower electrode structures. After deposition of the gap-filling layer, one or more portions of the layer overlying the lower electrode structures are removed using a wet or dry etch or a chemical-mechanical planarization technique.

In some embodiments that use an insulative polymer filler, the polymer includes a polymer-based ferroelectric material. (As used herein, the term "ferroelectric," indicates that a subject material, material composition, or material structure, exhibits a detectable spontaneous electrical polarization in response to appropriate electrical stimulus. Thus, the term without other express contextual modification or qualification generally encompasses elemental ferroelectric materials as well as combination and composite ferroelectric materials.) Useful ferroelectric polymers include polyvinylidene fluoride (PVDF), trifluoroethylene, (TrFe), and co-polymers of PVDF and TrFe. Useful co-polymers include the PVDF and TrFe in concentrations ranging from 10-90 percent. However, other embodiments may use other concentrations.

Some embodiments optimize the spin-characteristics of the ferroelectric polymer by controlling solvent concentrations. Useful solvent concentrations range between 20-80 percent. Such optimization can be achieved by changing the molecular weight distribution, copolymer composition, and/or polymer thickness.

Figure 3:
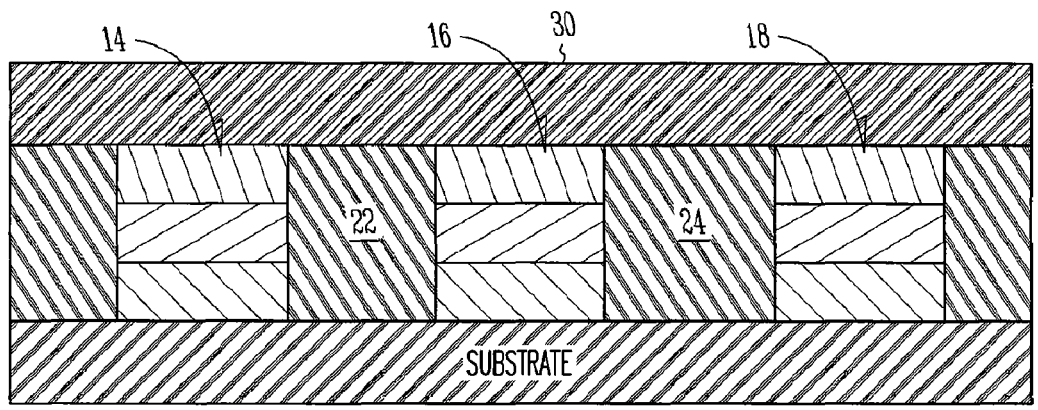
FIG. 3 is a cross-sectional view of the FIG. 2 assembly after forming polymer-based ferroelectric layer 30.

FIG. 3 shows that after forming gap-filling structures 22 and 24, the method entails formation of a polymer-based ferroelectric layer 30. More specifically, this polymer-based ferroelectric layer is formed to a thickness of 10-1000 nanometers. In this embodiment, polymer-based ferroelectric layer 30 has different characteristics than the gap-filling layer, more precisely polymer-based gap-filling structures 22 and 24. Specifically, unlike the polymer-based gap-filling structures 22 and 24, which is optimized for spin casting, polymer-based ferroelectric layer 30 is optimized for other properties, such as its ferroelectricity.

Notably, polymer-based ferroelectric layer 30 contacts only the gap-filling material (20, 22, 24) and the uppermost layers of lower electrode structures 14, 16, and 18. In some conventional polymer-based memory structures, the lower electrode structures are formed by lining a trench or other opening in an insulative surface with a diffusion barrier metal and then filling the lined trench with a second metal. In these conventional cases (which also lack the gap-filling layer and associated gap-filling structures), the polymer-based ferroelectric material therefore contacts both the trench-lining metal and the fill metal. This dual-metal interface is undesirable because it produces fringing fields.

Figure 4:
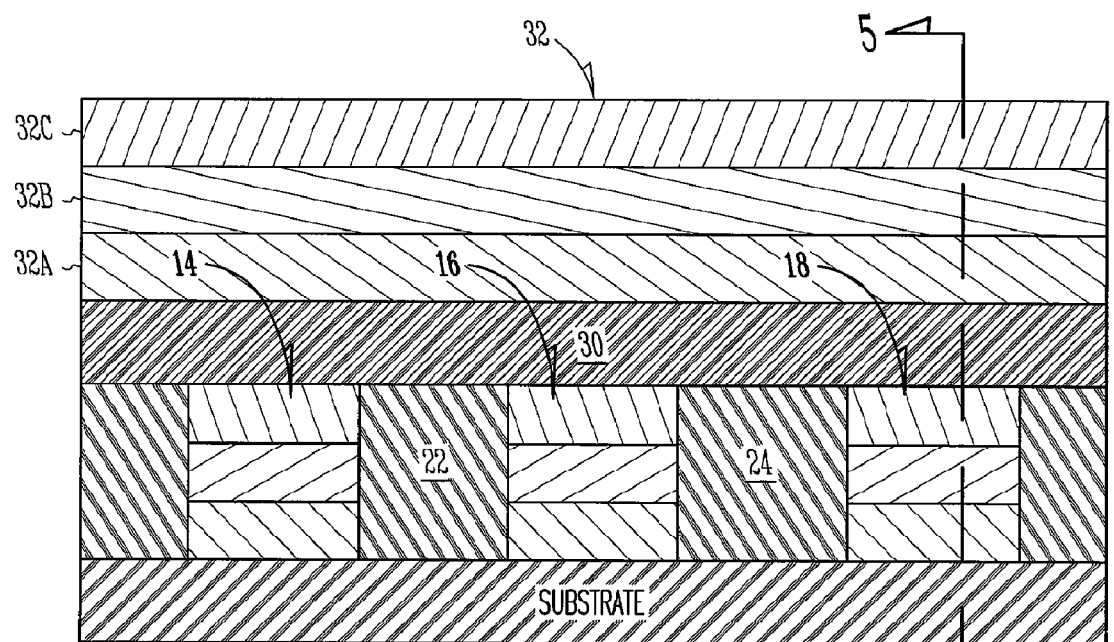
FIG. 4 is a cross-sectional view of the FIG. 3 assembly after forming conductive layers 32A, 32B, and 32C atop polymer-based ferroelectric layer 30.

FIG. 4 shows that the next step in the method entails sequentially forming conductive layers 32A, 32B, and 32C atop polymer-based ferroelectric layer 30. These conductive layers generally correspond in dimension and composition to those of lower electrode structures 14, 16, and 18. More specifically, conductive layer 32A is 5-100-nanometer-thick titanium layers 14A; conductive layer 32B is a 20-1000-nanometer-thick aluminum layer; and conductive layer 32C is a 5-100-nanometer-thick titanium-nitride layer. However, some embodiments use other materials and dimensions, as described for the lower electrode structures.

Figure 5:
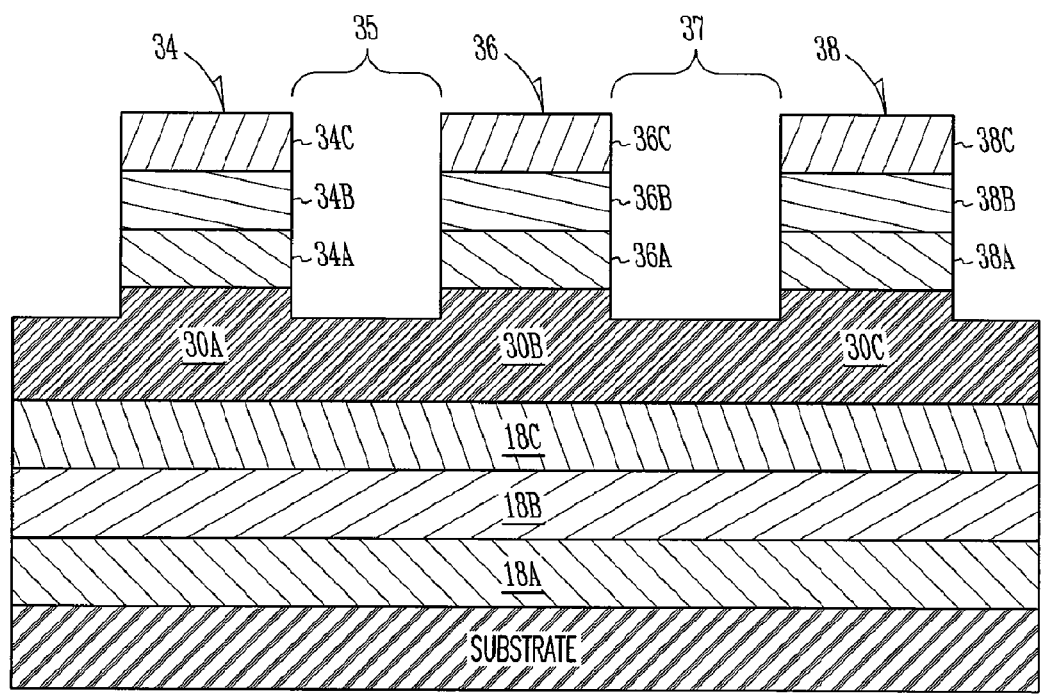
FIG. 5 is a cross-sectional view of the FIG. 4 assembly, taken along line 5-5, after forming upper electrode structures 34, 36, and 38.

FIG. 5, a cross-sectional view taken along line 5-5 of FIG. 4, shows that after forming conductive layers 32A, 32B, and 32C, the method forms these layers into upper electrode structures 34, 36, and 38. Formed orthogonal to the lower electrode structures 14, 16, and 18, and separated by gaps 35 and 37, upper electrode structures 34, 36, and 38 include respective 5-100-nanometer-thick titanium layers 34A, 36A, and 38A; respective 20-1000-nanometer-thick aluminum layers 34B, 36B, and 38B; and respective 5-100-nanometer-thick titanium-nitride layers 34C, 36C, and 38C. Notably, the thicknesses of the respective portions 30A, 30B, and 30C of polymer-based ferroelectric layer 30 separating each upper electrode structure from its counterpart lower electrode structure are substantially equal, even at the edges of the substrate.

In this embodiment, forming the upper electrode structures entails masking titanium-nitride layer 34 to define bars and etching it and layers 36 and 38 down into polymer-based ferroelectric layer 30. The depth of the etch, for example 2-30 percent of the layer thickness, is generally sufficient to ensure separation of the upper electrode structures.

Figure 6:
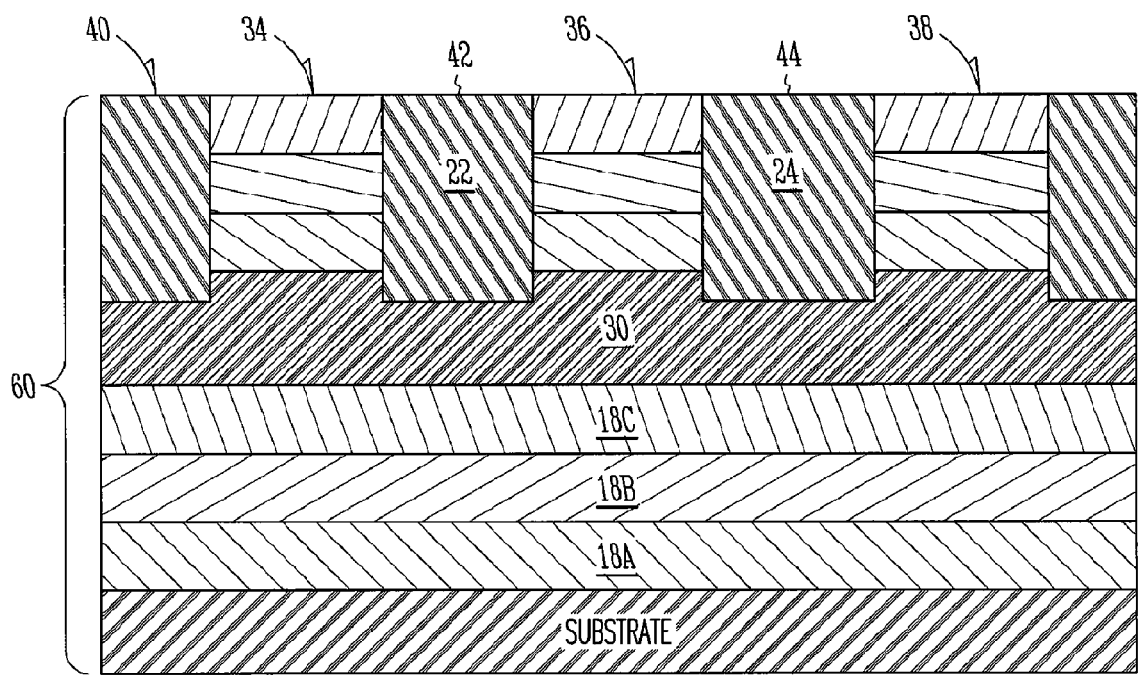
FIG. 6 is a cross-sectional view of the FIG. 5 assembly after forming gap-filling layer 40, to complete a first cross-point polymer-based memory array 60.

FIG. 6 shows that the method next forms a gap-filling layer 40, which substantially fills gaps 35 and 37 (in FIG. 4) with gap-filling structures 42 and 44, and thus completes a first polymer-based memory array 60. In this embodiment, gap-filling layer 40, which has a thickness at least as great as the height of the upper electrode structures plus the depth of the etch into ferroelectric layer 30, comprises an insulative material, such as a spin-on-glass material, an HDP oxide, an insulative polymer, or a polymer-based ferroelectric material, as in the formation of gap-filling layer 20. (Using a polymer-based ferroelectric material to fill the gaps may ameliorate fringe-field issues.) Forming the layer to this height entails spin casting the material and then planarizing using chemical-mechanical planarization for example, to expose upper electrode structures 34, 36, and 38. Some embodiments may expose the upper electrode structures using a dry or wet etch.

Figure 7:
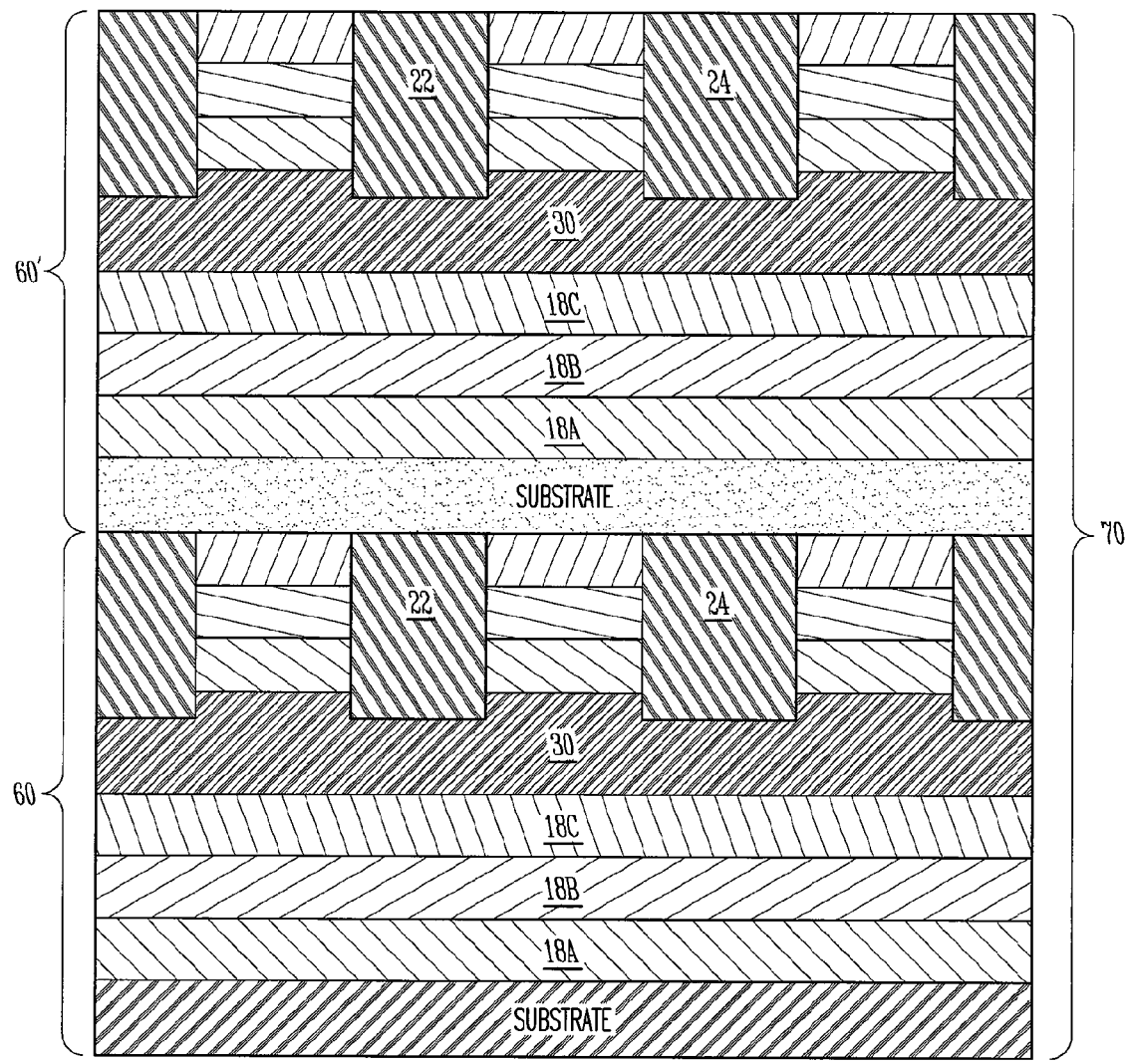
FIG. 7 is a cross-sectional view of the FIG. 6 assembly after forming a second cross-point polymer-based memory array structure 60' atop memory array 60.
Figure 8:
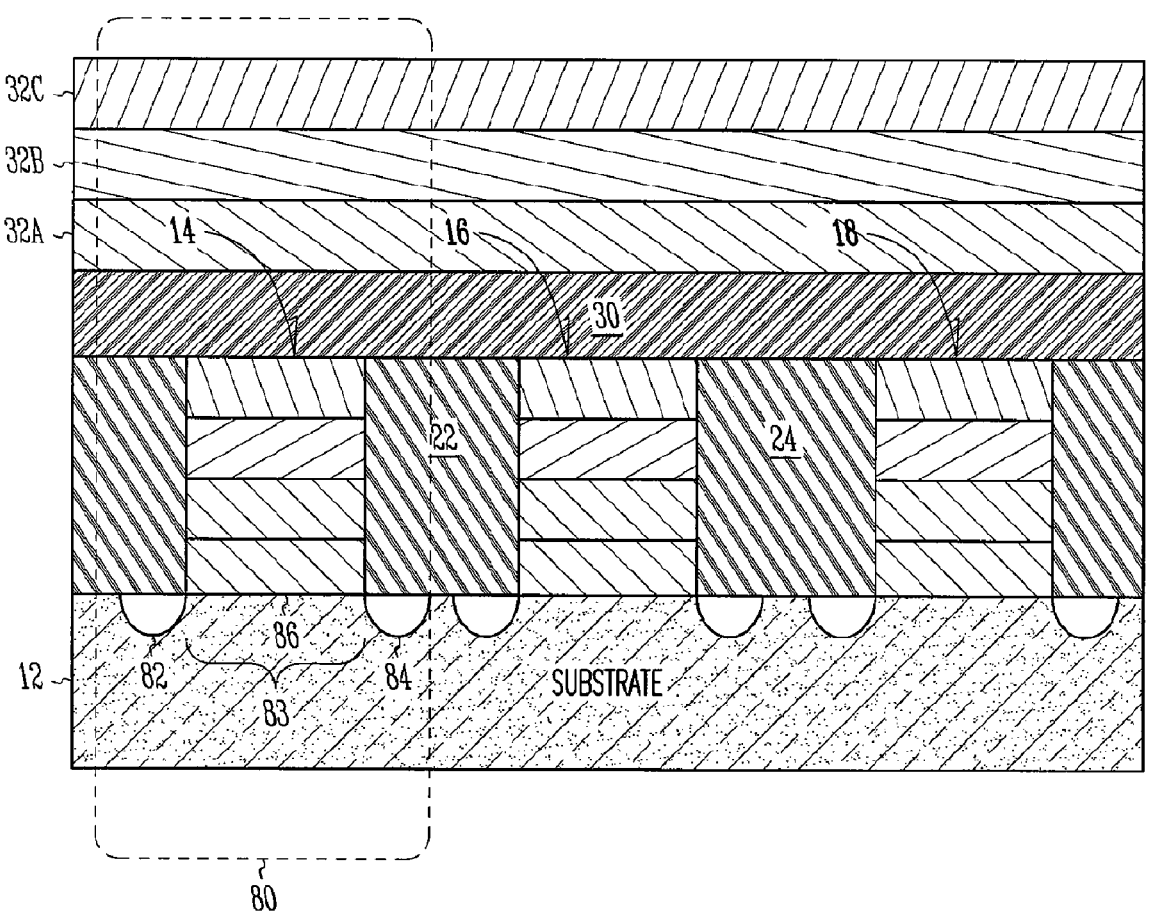
FIG. 8 is a cross-sectional view of a cross-point polymer-based memory array structure, which is similar to array 60 in FIG. 6, but includes floating gate polymer-based memory transistors, such as transistor 80.

FIG. 7 shows that the next step in the method may entail building at least one additional polymer-based memory array 60' atop memory array 60 to realize a multilevel memory array 70. The fabrication of memory array 60' may follow the same procedure used for memory array 60. However, other embodiments may make material and/or dimensional changes, or use entirely different methods and materials to realize other memory arrays, analogous or non-analogous to array 60. Although not shown, other embodiments continue by forming support circuitry and associated interconnections to realize a complete memory circuit.

FIG. 8 shows an alternative version of the integrated-circuit assembly in FIG. 3. The alternative version includes a semiconductive substrate 12 and a number of polymer-based ferroelectric floating gate transistors, of which transistor 80 is representative.

Transistor 80 includes self-aligned source/drain regions 82 and 84, a semiconductive channel region 83, and a gate insulator 86. Source and drain regions 82 and 84, formed using a conventional ion-implantation and diffusion techniques, define the length of channel region 83. Although this embodiment shows simple drain and source profiles, any desirable profile, for example, a lightly doped drain (LDD) profile, an abrupt junction or a "fully overlapped, lightly doped drain" (FOLD) profile, may be used. (Some profiles entail formation of insulative sidewall spacers on the lower electrode structure, before executing the ion-implantation procedure that forms the drain and source regions.) Gate insulator 86, which consists of a silicon oxide or other suitable dielectric material, lies between channel region 83 and lower electrode structure 14. Drain and source contacts (not shown) are formed and interconnected as desired to complete an integrated memory circuit In operation, the polarization state of a portion of the polymer-based ferroelectric in memory arrays described herein can be controlled by applying appropriate voltages to the electrode structures and/or to the gate, source and drains. Conventional circuitry and related techniques can also be used for sensing the polarization state of each memory cell in the arrays.

Figure 9:
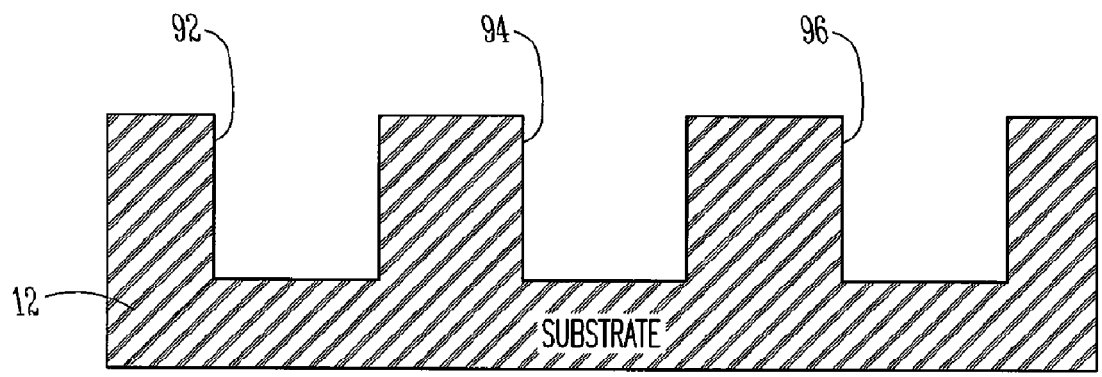
FIG. 9 is a cross-sectional view of an integrated-circuit assembly including a substrate 12 which has a number of trenches, such as trenches 92, 94, and 96.

FIGS. 9-12 show another series of integrated-circuit assemblies which sequentially and collectively illustrate another method of making a polymer-based ferroelectric memory array. (Other embodiments may be formed by changing the order of formation or by combining or eliminating formation or processing of certain features.) This method, as shown in FIG. 9, begins with forming in substrate 12 a number of trenches, such as trenches 92, 94, and 96. The trenches may be formed using any available technique appropriate for the composition of substrate 12. For example, if substrate 12 is an insulative material, such as silicon dioxide, one may form the trenches using conventional photolithographic techniques.

Figure 10:
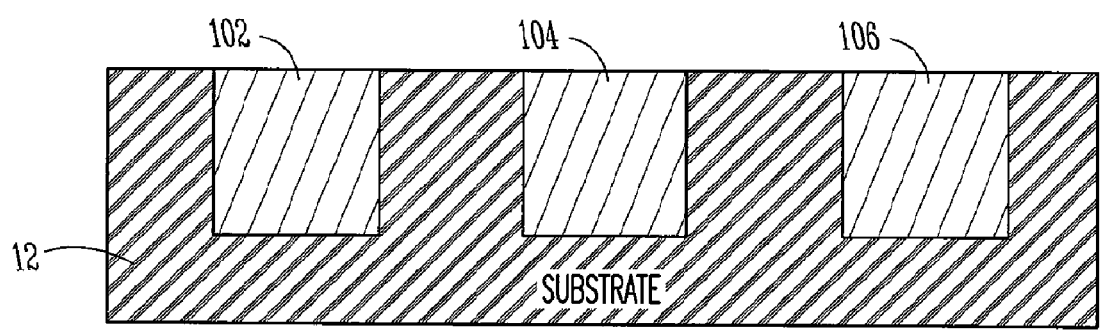
FIG. 10 is a cross-sectional view of the FIG. 9 assembly after formation of lower electrode structures 102, 104, and 106 in the trenches.

Next, FIG. 10 shows that this method forms lower electrode structures 102, 104, and 106 in the trenches. More specifically, this entails blanket depositing a conductive material, such as aluminum or titanium, over the trenches and surrounding substrate regions, with the layer having a thickness greater than the depth of the trenches. After the blanket deposition, the method removes conductive material outside the trenches using a planarization process, such as chemical-mechanical planarization. In this embodiment, planarization removes substantially all conductive material outside the trenches and leaves the conductive material within the trenches substantially flush with the top surface of the substrate, ultimately defining the lower electrode structures. Some other embodiments may form the lower electrode structures as multilayer structures, analogous to previously described lower electrode structures 14, 16, and 18.

Figure 11:
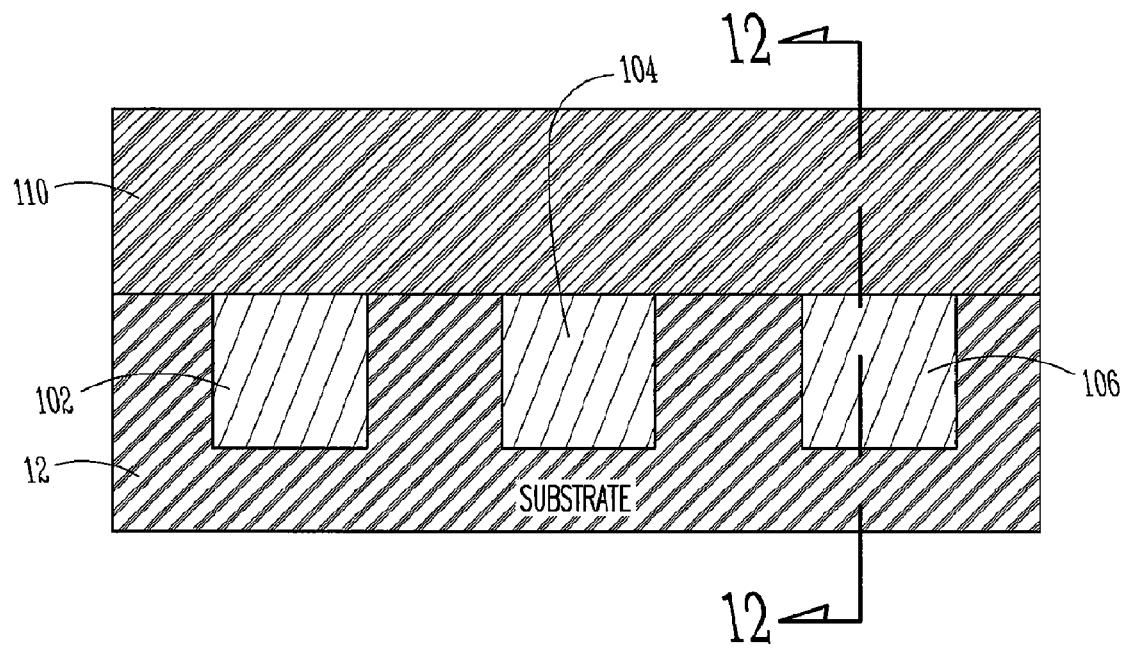
FIG. 11 is a cross-sectional view of the FIG. 10 assembly after formation of a polymer-based ferroelectric layer 110 over lower electrode structures 102, 104, 106.

FIG. 11 shows the results of forming a polymer-based ferroelectric layer 110 over lower electrode structures 102, 104, 106. It is expected that the aluminum or titanium composition of the lower electrode will provide sufficient adhesion and diffusion-barrier properties to interface effectively with the polymer-based ferroelectric layer. Notably, this form of material interface, like the previous embodiment, avoids undesirable fringing fields that result from multiple metallic layers contacting the polymer-based ferroelectric layer.

Figure 12:
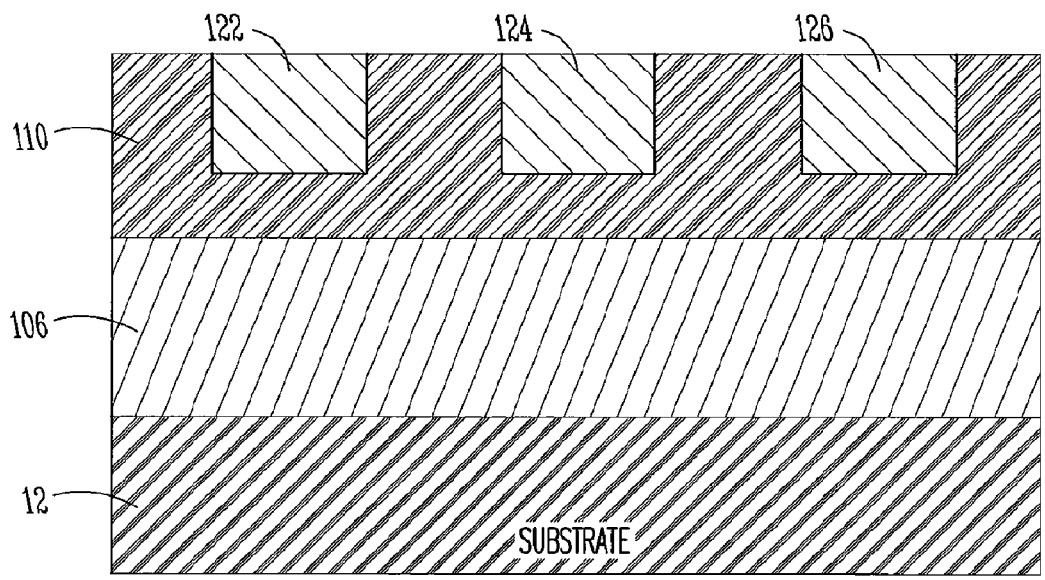
FIG. 12 is a cross-sectional view of the FIG. 11 assembly taken along line 12-12 of FIG. 11, after formation of upper electrode structures 122, 124, and 126 on polymer-based ferroelectric layer 110.
Figure 13:
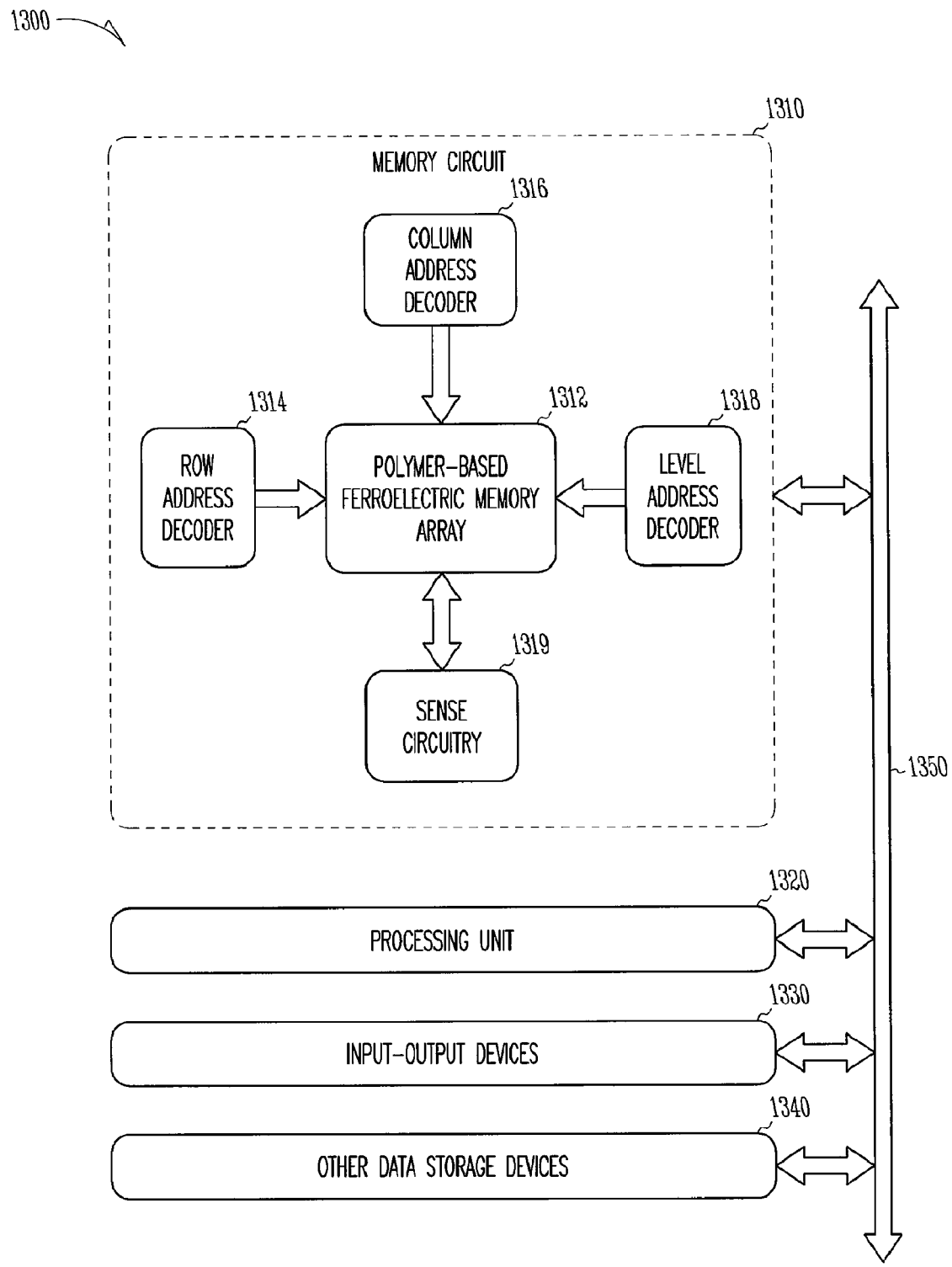
FIG. 13 is a block diagram of a system including a polymer-based ferroelectric-memory circuit that incorporates ferroelectric memory arrays and/or other structures according to the present invention.

FIG. 12, a cross-sectional view taken along line 12-12 of FIG. 11, shows that the method may next faun upper electrode structures 122, 124, and 126 on polymer-based ferroelectric layer 110. These upper electrodes generally correspond in dimension and composition to those of lower electrode structures 102, 104, and 106.

More precisely, this embodiment forms the upper electrodes by forming trenches in polymer-based ferroelectric layer 110 that are transverse or orthogonal to the lower electrodes, blanket depositing aluminum or titanium over the trenches and surrounding regions, and then removing substantially all the metal outside the trenches using a planarization process, such as chemical-mechanical planarization. The planarization ultimately forms upper electrode structures that are substantially flush with a top surface of the polymer-based ferroelectric layer, thus completing a polymer-based memory array 130. Some other embodiments may form the upper electrode structures as multilayer structures, analogous to previously described structures 34, 36, and 38.

Further processing can be used to define one or more additional polymer-based memory arrays atop memory array 130 to produce a multi-level memory analogous to multilevel memory array 70 in FIG. 7. Additionally, further processing may also define a number of polymer-based ferroelectric floating gate transistors.

Systems and Circuits

FIG. 13 shows a computer system 1300 including a memory circuit 1310, a processing unit 1320, input-output devices 1330, data-storage 1340, and a bus 1350. Memory circuit 1310, which operates according to well-known and understood principles and is coupled to one or more other components of the system via bus 1350, includes one or more memory arrays 1312, a row address decoder 1314, a column address decoder 1316, a level address decoder 1318, and sense circuitry 1319.

In this embodiment, memory arrays 1312 incorporate one or more of the memory arrays or intermediate integrated-circuit assemblies based on teachings of the present invention. Also, in this embodiment, memory arrays, the address decoders, and the sense circuitry exist in a single integrated circuit. However, in other embodiments, one or more may exist on separate integrated circuits.

Processing unit 1320, input-output devices 1330, and data-storage devices 1340 are intercoupled conventionally via bus 1350. Processing unit 1320 includes one or more processors or virtual processors. Input-output devices 1330 includes one or more keyboards, pointing devices, monitors, etc. And data-storage devices 1340 include one or more optical, electronic, or magnetic storage devices.

CONCLUSION

In furtherance of the art, the inventors have presented unique methods and structures for polymer-based ferroelectric memories. One method entails forming two or more first conductive structures on a substrate, with at least two of the first electrode structures separated by a gap, forming a gap-filling structure within the gap, and forming a polymer-based ferroelectric layer over the gap-filling structure and the first electrode structures. Two or more second electrode structures are then formed over the polymer-based ferroelectric layer, orthogonal to the first electrode structures. Notably, the gap-filling structures may facilitate formation of a substantially planar and uniformly thick polymer-based ferroelectric layer, thereby promoting memory performance and yield.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A memory device comprising:
at least two electrode structures that include at least two dissimilar and abutting metal layers on a surface, the two electrode structures separated by a gap; and
a polymer-based ferroelectric layer overlying and directly abutting the two electrode structures.

2. The memory device of claim 1, wherein the polymer-based ferroelectric layer consists essentially of polyvinylidene fluoride, trifluoroethylene, or a composite polymer.

3. The memory device of claim 1, further comprising:
a gap-filling structure disposed at least partly within the gap, wherein the polymer-based ferroelectric layer overlies the gap-filling structure.

4. The memory device of claim 3, wherein the gap-filling structure is substantially flush with top surfaces of the two electrode structures.

5. The memory device of claim 3, wherein the gap-filling structure consists essentially of a polymer or a spin-on-glass material.

6. A memory device comprising:
at least two electrode structures, at least one of which includes at least two dissimilar and abutting metal layers on a surface, the two electrode structures separated by a gap;
a gap-filling structure disposed at least partly within the gap; and
a polymer-based ferroelectric layer overlying the two electrode structures and the gap-filling structure, wherein the polymer-based ferroelectric layer directly abuts the two electrode structures.

7. The memory device of claim 6, wherein the gap-filling structure substantially fills the gap between the two electrode structures.

8. The memory device of claim 6, wherein the gap-filling structure comprises a polymer having different spin characteristics than a polymer used to form the polymer-based ferroelectric layer.

9. The memory device of claim 6, wherein the gap-filling structure comprises at least one of spin-on glass, a high-density-plasma oxide, flow-fill oxide, or a polymer.

10. The memory device of claim 6, comprising at least one elongated electrode on the surface, the one elongated electrode oriented substantially perpendicular to the two electrode structures.

11. A memory device comprising:
at least two first electrode structures on a surface, the two first electrode structures separated by a first gap that is partly filled by a first gap-filling structure;
a first polymer-based ferroelectric layer overlying the two first electrode structures and the first gap-filling structure, the first polymer-based ferroelectric layer directly abutting the two first electrode structures;
at least two second electrode structures on the first polymer-based ferroelectric layer, with at least a portion of each of the two second electrode structures overlying a portion of at least one of the two first electrode structures;
an insulative layer overlying the two second electrode structures;
at least two third electrode structures overlying the insulative layer, the two third electrode structures separated by a second gap that is partly filled by a second gap-filling structure; and
a second polymer-based ferroelectric layer overlying the two third electrode structures and the second gap-filling structure, the second polymer-based ferroelectric layer directly abutting the two third electrode structures.

12. The memory device of claim 11, wherein at least one of the two first electrode structures, the two second electrode structures, or the two third electrode structures include at least two dissimilar and abutting metal layers.

13. The memory device of claim 11, wherein the polymer-based ferroelectric material consists essentially of polyvinylidene fluoride, trifluoroethylene, or a composite polymer.

14. The memory device of claim 11, wherein the first gap-filling structure substantially fills the gap between the two first electrode structures.

15. The memory device of claim 11, wherein the first gap-filling structure is substantially flush with top surfaces of the two first electrode structures.

16. The memory device of claim 11, wherein the first gap-filling structure consists essentially of a polymer or a spin-on-glass material.

17. A system comprising:
  at least one processing unit; and
  a memory device coupled to the processing unit, the memory device comprising:
    a memory array comprising:
      at least two first electrode structures on a surface, the two first electrode structures separated by a gap;
      a gap-filling structure disposed at least partly within the gap; and
      a polymer-based ferroelectric layer overlying the two first electrode structures and the gap-filling structure, the polymer-based ferroelectric layer directly abutting the two first electrode structures and the gap-filling structure.

18. The system of claim 17, wherein the memory device further comprises at least two address decoder circuits and at least one sense circuit coupled to the memory array.

19. The system of claim 17, wherein the memory array further comprises at least one second electrode structure supported by the polymer-based ferroelectric layer and overlying a portion of at least one of the two first electrode structures, and wherein at least one of the two first electrode structures includes at least two dissimilar and abutting metal layers.

20. The system of claim 17, wherein the gap-filling structure substantially fills the gap between the two first electrode structures.

* * * * *